US008486747B1

(12) United States Patent
Gilman

(10) Patent No.: US 8,486,747 B1
(45) Date of Patent: Jul. 16, 2013

(54) BACKSIDE SILICON PHOTOVOLTAIC CELL AND METHOD OF MANUFACTURING THEREOF

(76) Inventor: Boris Gilman, Mountain View, CA (US)

( * ) Notice: Subject to any disclaimer, the term of this patent is extended or adjusted under 35 U.S.C. 154(b) by 0 days.

(21) Appl. No.: 13/448,974

(22) Filed: Apr. 17, 2012

(51) Int. Cl.
H01L 21/00 (2006.01)
(52) U.S. Cl.
USPC ......... 438/57; 438/63; 438/558; 257/E21.141
(58) Field of Classification Search
USPC .................. 438/57, 63, 558; 257/E21.141
See application file for complete search history.

(56) References Cited

U.S. PATENT DOCUMENTS

| 6,262,359 | B1 | 7/2001 | Meier et al. | |
|---|---|---|---|---|
| 6,429,037 | B1 | 8/2002 | Wenham et al. | |
| 7,615,393 | B1 | 11/2009 | Shah et al. | |
| 7,820,475 | B2 | 10/2010 | De Ceuster et al. | |
| 7,897,867 | B1 | 3/2011 | Mulligan et al. | |
| 7,928,015 | B2 | 4/2011 | Fork | |
| 8,105,869 | B1 | 1/2012 | Gilman | |
| 2009/0025786 | A1 | 1/2009 | Rohatgi et al. | |
| 2010/0012185 | A1 | 1/2010 | Schmid et al. | |
| 2010/0068848 | A1 | 3/2010 | Kuo | |
| 2010/0159633 | A1 | 6/2010 | Lee et al. | |
| 2012/0048376 | A1* | 3/2012 | Gilman | 136/261 |
| 2012/0171804 | A1* | 7/2012 | Moslehi et al. | 438/71 |
| 2012/0270359 | A1* | 10/2012 | Kumar et al. | 438/71 |
| 2012/0305063 | A1* | 12/2012 | Moslehi et al. | 136/256 |

FOREIGN PATENT DOCUMENTS

BG 109881 12/2008

OTHER PUBLICATIONS

F.Granek. "High-efficiency back-contact back-junction silicon solar cells research in Fraunhofer ISE", Proc.of 23rd European PV Solar Energy Conf., Spain,991-995(2008).
"Towards 20% efficient N-type silicon solar cells with screen-printed aluminum-doped rear emitter", Proc. of 23rd European PV Solar Energy Conf, Spain, 982-987 (2008).

* cited by examiner

Primary Examiner — Trung Q Dang

(57) ABSTRACT

Proposed is the backside silicon photovoltaic cell and method for forming backside selective emitters, backside doped base contact regions, backside field-induced emitters, FSF-regions, and contacts to the functional regions of a backside solar cell by essentially electrical means and without conventional thermal diffusion and masking processes. The process includes forming conductive layers on both sides of an intermediate device structure, performing Joule heating by passing electrical current through the backside conductive layers thus forming the selective emitters, the base contact regions, and contacts to the functional regions. The obtained structure is then subjected to pulse electrical treatment by applying a voltage pulse or pulses between the front and back conductive layers to form the field-induced emitter and the field-induced FSF. After the conductive layers are removed, a final solar cell is obtained. The proposed method can significantly simplify manufacturing, reduce cost, and increase throughput in the field of semiconductor fabrication.

22 Claims, 9 Drawing Sheets

BACKSIDE SILICON PHOTOVOLTAIC CELL AND METHOD OF MANUFACTURING THEREOF

FIELD OF THE INVENTION

The invention relates to a backside silicon-based photovoltaic cell and method of manufacturing thereof. More specifically, the invention relates to the method of forming backside selective emitters, backside field-induced emitters, backside doped base contact regions, backside self-aligned contacts and front surface field region by essentially Joule heating and other electrical means and without conventional thermal diffusion and photo masking processes. The proposed method can significantly simplify manufacturing, reduce cost, and increase throughput of a solar cell fabrication.

BACKGROUND

At the present time photovoltaic or solar cells (SC) are classified into three generations, which are described below.

First-generation solar cells are silicon-based solar cells (Si—SC) that dominate the solar market (80 to 90%). Solar cells of this type are manufactured of mono-crystalline or polycrystalline silicon, and, in spite of high manufacturing cost (typically ranging from $3/W to $5/W which is much higher than is required for wide implementation), popularity of these SC results from their high efficiency, well developed processing, and practically unlimited availability of silicon.

Solar cells of the second generation are also known as thin-film solar cells (TF-SC). The cells of this type are less expensive, lighter in weight, and more attractive in appearance than solar cells of the first generation. However, they are less efficient than first-generation cells.

Third-generation cells contain a wide range of potential device and material innovations, including organic SC, nanomaterial-based cells, dye-synthesized SC (DSSC) and others.

Irrespective of a provision of later generations, interest in SC of the first generation remains very keen, and research in this direction continues. The high fabrication cost of the first-generation Si—SC results mainly from several high-temperature processes required to form emitters and selective emitters, doped base contact regions, passivation and anti-reflection layers, metal contacts, back-surface field (BSF) regions, which are required on front-side SC, and front-surface field (FSF) regions, which are required on backside SC, etc. The aforementioned set of functional SC regions represent the SC functional structure. Emitters and selective emitters, doped base contact regions, BSF and FSF regions generally require doping which is different from the substrate doping The present application applies specifically to the Si-based backside SC which will be further referred to as BS-SC.

BS-SC functional structure and fabrication of BS-SC are described e.g., in "High-efficiency back-contact back junctionsilicon solar cells research at Fraunhofer ISE" by F. Granek et al., Proceedings 23$^{rd}$ *European Photovoltaic Solar Energy Conference,* Valencia, Spain, pp. 991-995 (2008).

Generally the BS-SC fabrication requires high-temperature diffusion for all doped functional regions of the SC such as backside emitters and selective emitters, backside doped base contact regions and FSF (see e.g. U.S. Pat. No. 7,897,867 issued on Mar. 1, 2011 to W. P. Mulligan et al.) All diffusions are typically performed in high-temperature thermal diffusion furnaces, belt furnaces, and may require rapid thermal annealing (RTA) chambers. Diffusion and annealing processes are generally power-consuming and time-consuming, and equipment with which these processes are carried out generally requires periodic calibration, testing, and maintenance. Another source of complexity and cost increase in the manufacture of first-generation SC is patterning, a process that typically involves the use of several photolithography operations or other masking steps for forming selective emitters, base contact regions, metal electrodes, and other cell elements.

Attempts have been made to simplify fabrication of BS-SC, e.g., by reducing the number of masking, diffusion, and passivation steps, which are used in screen printing or jet printing with consecutive annealing of screen-printed layers. For example, conductive electrodes can be formed by the back-side screen-printing and annealing technique as described e.g. in U.S. Patent Application Publication No. 20090025786, published on Jan. 29, 2009, inventors: Ajeet Rohatgi, et al).

U.S. Pat. No. 7,897,867 issued on Mar. 1, 2011 to W. P. Mulligan et al, for example, described BS-SC fabrication where printing techniques are utilized in selectively forming masks for use in etching of silicon oxide and diffusing dopants and in forming metal contacts to the diffused regions. The patent also describes the process of forming self-aligned stack of metals for backside contacts. While the described method may be less expensive than a regular microelectronic circuit processing it sill requires several high-temperature furnace-based diffusions for forming backside emitters, backside doped base contact regions and FSF.

U.S. Pat. No. 7,928,015 issued on Apr. 19, 2011 to David K. Fork describes the SC fabrication in which wafer-based solar cells are efficiently produced by extruding a dopant bearing material (dopant ink) onto one or more predetermined surface areas of a semiconductor wafer, and then thermally treating the wafer to cause diffusion of dopant from the dopant ink into the wafer to form corresponding doped regions. A multi-plenum extrusion head is used to simultaneously extrude interdigitated dopant ink structures having two different dopant types (e.g., n-type dopant ink and p-type dopant ink) in a self-registered arrangement on the wafer surface. The described method provides simultaneous deposition on a silicon wafer of several pre-patterned doping sources, but the actual doped regions are consequently formed by a thermal diffusion as usual.

U.S. Pat. No. 7,820,475 issued on Oct. 26, 2010 to Dennis De Ceuster et al. describes the process with fewer diffusion steps in which the functional doped regions on the backside of the wafers (such as selective emitters and doped base contact regions) and FSF are formed and patterned by screen-printing and etching of several doping sources deposited on a substrate. In this method at least one high-temp diffusion is still required to form the BS-SC functional structure.

Another printing method of patterning of a SC functional structure is described in the paper titled "Inkjet printing for high efficiency selective emitter solar cell", Proceedings of 23$^{rd}$ *European Photovoltaic Solar Energy Conference,* Valencia, Spain, pp. 1687-1690 (2008). It should be noted that in this and preceding reference a high-temp furnace-based diffusions remain necessary for forming doped functional regions of SC.

US Patent Application Publication No. 20100068848 (published on Mar. 18, 2010; inventors: Kuo, Ming-Chin, et al) describes a one-step diffusion method of fabricating light doping regions and heavily doped regions in the Si—SC.

Another efficient attempt to minimize the number of diffusion, passivation, and masking operations in solar cell fabrication is disclosed in U.S. Pat. No. 7,615,393 issued on Nov. 10, 2009 to Sunil Shah, et al. The method described in this patent provides a substrate that is doped with boron and includes a first substrate surface with a first surface region and a second surface region. A first set of nanoparticles, which includes a first dopant, is deposited on the first surface region. The substrate is heated in an inert ambient to a first temperature, whereby a first densified film is created, and then a first diffused region (that later serves as a selective emitter) is formed with the first diffusion depth in the substrate beneath the first surface region. The method also includes exposing the substrate to a diffusion gas that includes phosphorous at a second temperature for forming a phosphorosilicate glass (PSG) layer on the first substrate surface, and then a second diffused region with a second diffusion depth (that serves as a lower doped emitter) is formed in the substrate beneath the second surface region wherein the first diffused region is proximate to the second diffused region. The method further includes exposing the substrate to an oxidizing gas at a third temperature, wherein an $SiO_2$ layer is formed between the PSG layer and the substrate surface, wherein the first diffusion depth is substantially greater than the second diffusion depth (i.e. the selective emitter regions are deeper and heavier doped than the lower doped emitter region). Thus, multi-doped junctions are formed on a substrate essentially without photolithography.

While this method represents an interesting advance toward simplification of solar cell manufacturing and can be applied to BS-SC fabrication, it still requires at least one complex thermal diffusion process (step that includes using a dopant gas). Also, diffusion of phosphorus onto the front surface is conducted simultaneously with diffusion of aluminum onto the back side, which may cause uncontrolled doping on the back-side doped regions. Furthermore, this method requires alignment of the metal electrodes to the selective emitters and doped base contact regions, which is not done automatically and which may involve additional steps.

U.S. Patent Application Publication No. 20100012185 (published on Jan. 21, 2010; inventors: Christian Schmid, et al) and U.S. Pat. No. 6,262,359 issued on Jul. 17, 2001 to Daniel Meier, et al, describe a process wherein aluminum or aluminum-containing paste is deposited on the back side of a solar cell and is annealed to create a back-surface field (BSF) region without performing a thermal diffusion step. Also in the paper titled "Towards 20% efficient N-type silicon solar cells with screen-printed aluminum-alloyed rear emitter", Proceedings of $23^{rd}$ European Photovoltaic Solar Energy Conference, Valencia, Spain, pp. 982-987 (2008) the process of forming backside Al-doped emitter is described, which includes using screen-printing of Al-based paste and annealing in the belt furnace. The described method also includes a photolithography and a thermal diffusion steps performed on the front surface.

U.S. Pat. No. 6,429,037 issued on Aug. 6, 2002 to Stuart R. Wenham, et al, discloses a method for forming selective emitters without recourse to a conventional diffusion step generally required for the formation of heavily doped regions of selective emitters. This is achieved by means of laser-assisted local heating of a dopant source that also serves as a passivation layer and mask for consequent metallization. The method also allows formation of self-aligned contacts on selective emitter regions. This method has some advantages; however, it requires at least one thermal diffusion operation, complex optimization of the laser operation, and, potentially, additional deposition and annealing steps.

U.S. Pat. No. 8,105,869 issued on Feb. 14, 2012 to B. Gilman discloses the method for forming selective emitters, field-induced emitters, back-surface field regions, and contacts to the functional regions of a solar cell by essentially electrical means and without conventional thermal diffusion and masking processes. The process includes forming conductive layers on both sides of an intermediate solar-cell structure, performing electrical and thermal treatment by passing electrical current independently through the front-side conductive layer and the back-side conductive layer, thus forming the selective emitters, the selective BSF regions, selective emitter contact regions, and contacts to the selective BSF regions. The obtained structure is then subjected to pulse electrical treatment by applying a voltage pulse or pulses between the front and back conductive layers to form the field-induced emitter and the field-induced BSF region. After the conductive layers are removed, a final solar cell is obtained.

Although the above method comprises using a Joule heating and electrical pulse treatment for forming functional regions of the solar cell, it applies essentially to the front-side cells, in which selective emitters, field-induced emitters and contacts to those regions are formed on the front-side of the silicon substrate, while the backside doped regions (selective BSF) and field-induced BSF regions are formed on the back side of the substrate. Also, in this method an electrothermal treatment (Joule heating) is conducted, separately or in parallel, by passing electrical current through the front-side conductive layer and by passing another electrical current through the backside conductive layer.

Bulgarian Patent No. BG109881 issued on Dec. 30, 2008 to Petko Vitanov, et al, describes a solar cell with an emitter, that is made in the form of an inversion layer, (further referred to as a field-induced emitter in the present application) wherein the front-side field-induced emitter is formed by an electric field generated by an electric charge developed in a dielectric antireflective coating on the front surface of the solar cell. However, this type of cell requires formation of selective N+ doped emitters and BSF regions by means of conventional high-temperature diffusion.

Finally U.S. Patent Application Publication No. 2010159633 (published on Jun. 24, 2010; inventors: Lee Boung-Kyu et al) describes method of producing photovoltaic device (i.e.SC) using Joule heating-induced recrystallization method. The described method applies to forming a photo conversion layer (i.e. a photoactive substrate) and not to forming any functional doped regions such as selective emitters and others.

In view of foregoing there is a desire to build a BS-SC wherein all critical functional regions are formed on the back side of the silicon substrate by the single process of Joule heating and following electrical pulse treatment. Such solution will provide a significant reduction of a manufacturing cost.

SUMMARY

The present method provides formation of a backside silicon photovoltaic cell, particularly a backside solar cell (BS-SC) that includes backside selective emitters, field-induced emitters, backside doped base contact regions, contacts to the backside selective emitters, backside base contacts, front-surface field (FSF) regions, insulating layers and other elements of a solar cell by means of Joule heating and a pulse electrical treatment without furnace-based thermal diffusion and photolithography steps. Once an initial device structure is formed, an entire functional solar cell structure is essentially formed by well-controlled Joule heating and by a pulse electrical treatment.

More specifically, the method comprises silicon substrate that has back side and a front side, the steps of forming backside selective emitters, backside field-induced emitters, backside doped base contact regions, contacts to the backside selective emitters, backside base contacts and field-induced front side field region, said steps comprise:

provide a silicon substrate that has a front side and a back side, forming dopant-containing regions on the back side of the silicon substrate in the areas designed at least for the backside selective emitters;

forming a silicon oxide layer at least on the back side of the silicon substrate forming a backside insulating layer onto the back side of the silicon substrate and over said dopant-containing regions;

forming a front-side insulating layer onto the front side of the silicon substrate;

forming backside windows in said backside insulating layer over the dopant-containing regions to expose at least a part of the surface of the dopant-containing regions;

depositing a first backside conductive layer onto said backside insulating layer, and over the parts of said dopant-containing regions, which are exposed, and further depositing a second backside conductive layer onto said first backside conductive layer, thus obtaining an intermediate device structure, performing a Joule heating step by passing electrical current through said first backside conductive layer and through said second conductive layer to heat the dopant-containing regions to the temperature required for diffusion of the dopant from said dopant-containing regions to the silicon substrate in order to form the backside selective emitters, the backside doped base contact regions, essential parts of the contacts to said backside selective emitters and essential parts of the backside base contacts, cooling an intermediate device structure to an equilibrium state, depositing a front-side conductive layer onto the front-side insulating layer, thus obtaining a second intermediate device structure, subjecting the second intermediate device structure to pulse electrical treatment by applying at least one electrical pulse between said front-side conductive layer and said backside second conductive layer, removing parts of the first backside conductive layer and the second backside conductive layer by the step of selective etching, thus forming the contacts to the backside selective emitters and the backside base contacts, removing the front-side conductive layer, thus obtaining a pre-final device structure, depositing output electrodes to the backside selective emitters and to the backside doped base contact regions by electroplating, thus obtaining a final device structure, subjecting the final device structure to a second pulse electrical treatment by applying at least one additional electrical pulse between said output electrodes, in order to isolate the backside field-induced emitter from the backside doped base contact regions

DETAILED DESCRIPTION OF THE INVENTION

In order to understand the principle of the present method, it would be advantageous to give definition of the main terms used in the present application.

Backside Selective Emitters (SE) are heavily doped regions formed on a back side of a silicon substrate at selected locations, wherein a type of doping is opposite to the one of the substrate Backside Doped Base Contact (DBC) regions are heavily doped regions formed on a back side of a silicon substrate at selected locations, which are separated from the locations of the backside SE, wherein a type doping is the same as in the substrate Backside Field-induced Emitter (also known as Inversion-layer Emitter) is an inversion layer formed at the back side of the substrate between the backside SE-regions and the backside DBC-regions and having a direct contact to the backside SE-regions Field-Induced front surface field (FSF) is an accumulation layer formed at the front side of the substrate The rest of the terms are common and self-explanatory.

The method of the invention will now be described in more details by way of a specific example related to manufacture of a BS-SC. However, this example should not be construed as limiting the scope of the invention application to solar cells only. The method will be described in the form of sequential manufacturing steps with reference to the attached drawings. In these drawings, the evolving device structure of the solar cell will be shown in a cross section. It should be noted that only significant steps of the process are shown.

Figure 1:
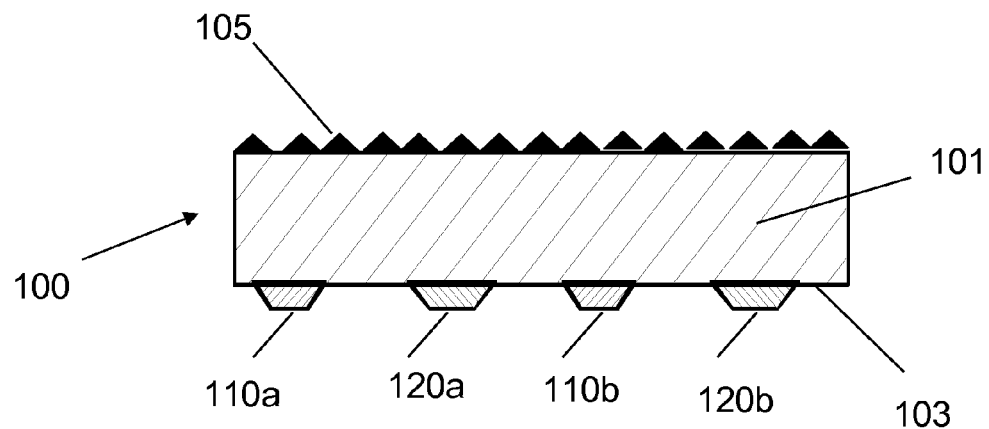
FIG. 1 illustrates an initial step 1 of the process, in which a mono-crystalline or polycrystalline silicon substrate is provided, and a dopant substances of two types are applied onto the back side thus forming patterned dopant-containing regions. Hereinafter the structures are shown in cross sections.

Step 1 of the method is shown in FIG. 1 At this step an initial device structure 100 comprises a silicon substrate 101 made of a mono-crystalline or polycrystalline silicon is provided, and a dopant substance is applied to the back side 103 of the substrate 101. The substrate 101 can be a P-type or N-type, can have a thickness in the range of 80 um to 300 μm, and can have a resistivity ranging from 0.1 to 10 Ohm·cm. The front side 105 of the substrate 101 can be textured as shown. It is understood that the term "back side" relates to the side of the substrate that is opposite to the light-receiving (front) side in a complete solar cell. To perform a specific process step of the present method the back side of the substrate can be positioned in a direction that provides a convenient and reasonable processing. In further description the substrate 101 is assumed to be P-type.

A dopant substances is applied onto the back side 103 of the substrate 101 to form local dot-like or stripe-like dopant-containing regions 110a,120a,110b,120b. The dopant-containing regions of one type (references 110a,110b) may comprise, e.g., doped silicon nanoparticles of N-type, phosphorus-containing paste and the like, and the dopant-containing regions of a second type (references 120a,120b) may comprise, e.g., doped silicon nanoparticles of P-type, boron-containing paste or the like, as described e.g. in the aforementioned U.S. Pat. No. 7,615,393. The dopant substance of at least one type can be selected from the variety of doped inks and pastes as described e.g. in the U.S. Pat. No. 7,928,015, U.S. Pat. No. 7,897,867 and others. The dopant-containing regions can be formed on the back side 103 e.g. by the process selected from the group containing a screen printing or jet printing. Dopant-containing regions 110a . . . 120b may have a thickness in the range of 500 nm to 2000 nm and a width of 100 um to 500 μm. The dopant-containing regions are applied at least onto areas, where backside selective emitters of the BS-SC are to be formed in subsequent steps (110b, 110b). In the same manner the dopant-containing regions may be applied onto areas where backside doped base contact regions of the BS-SC are to be formed in subsequent steps (120a,120b). It is understood that while only two dopant-containing regions of each type are shown in FIG. 1, in reality there is a plurality of such regions on the back side of the substrate 101.

Figure 2:
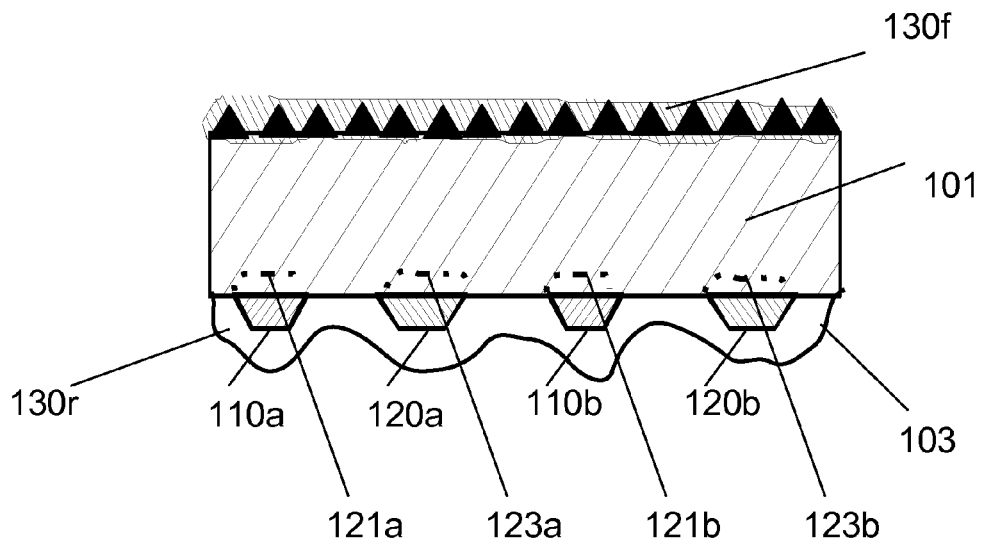
FIG. 2 illustrates an intermediate step 2 of the process, in which front-side and backside insulating layers are formed and in which initial sintering of the dopant substances is carried out.

Step 2, which is shown in FIG. 2, shows a device structure in which a backside insulating layer 130r is formed onto the back side of the substrate and over the backside dopant-containing regions, and a front-side insulating layer 130f is formed onto the front side of the substrate. At this step an initial sintering of the dopant-containing regions is carried out. The insulating layers 130f and 130r on the front side and the back side respectively nay include sub-layers (not shown) such as thin thermally grown silicon oxide ($SiO_2$) layer and a silicon nitride layer ($Si_3N_4$) deposited on the silicon oxide layer. Total thickness of the insulating layers can be in the range of 70-200 nm. The purpose of the backside insulating layer 130r is to reliably passivate the backside surface 103 and to create sufficient barrier for a subsequent diffusion of the metal atoms (see FIG. 6 below). Additionally, the insulating layer 130r forms a charged retention barrier which may be required for dielectric charging in subsequent pulse electrical treatment (see FIGS. 8,9 below). The insulating layer 130f on the front side can be used as an anti-reflecting (AR) coating for the emerging solar cell. It is understood that the insulating layers are formed on the substrate by well known processes such as thermal growth at the temperatures of e.g. 850-950 C, CVD depositions at the temperatures of e.g. 350-450 C and the likes.

In the process of forming insulating layers 130f and 130r the dopant-containing regions 110a, . . . 120b experience an initial sintering and oxidation, which results in solidifying the dopant substances. This is done for the purpose of creating conditions for an efficient subsequent diffusion of dopant atoms from the dopant-containing regions into the substrate 101 as described below. Furthermore, during initial sintering shallow low-doped regions 121a,123a,121b,123b (shown with the dashed-dotted lines) are formed in the substrate 101 at the locations of the dopant-containing regions. In one aspect of the proposed method the initial sintering can be completed prior to forming insulating layers 130f and 130r. To protect the back side of the substrate from potential penetration of metal atoms during subsequent steps an initial thickness of the insulating layer 130f may be greater than necessary for an efficient AR performance. In order to reduce the thickness of the layer 130f down to the required AR range, e.g., of 65 to 75 nm, an additional step of thinning the front-side insulating layer 130f may be required at the end of the process.

Figure 3:
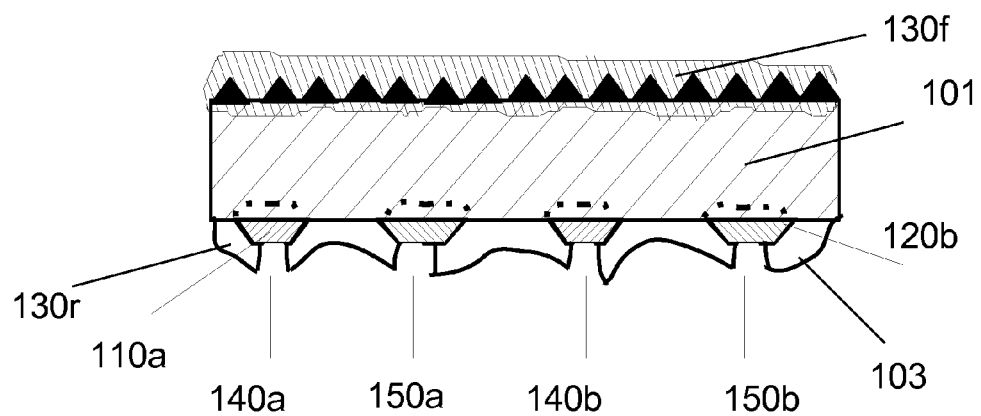
FIG. 3 illustrates a further intermediate step 3 of the process, in which widows are formed in the backside insulating layer.

Step 3, which is shown in FIG. 3, is aimed at forming backside windows 140a, 150a, 140b, 150b in the backside insulating layer 130r of the device structure, which exposes at least a part of the surface of the dopant-containing regions. Since the positions of the dopant-containing regions 110a, . . . 120b can be seen through the backside insulating layer 130r which is transparent and, in view of a significant thickness and relatively large lateral size of the dopant-containing regions 110a, . . . 120b, the windows 140a . . . 150b can be cut, e.g., by means of a screen printing and etching as described e.g. in the U.S. Pat. No. 7,897,867 above. Alternatively it can be done by laser (as described in U.S. Pat. No. 6,426,235 issued on Jul. 30, 2002 to T. Matsushita, et al). The backside windows 140a, . . . 150b may have a width, e.g., in the range of 20 um to 300 um.

Figure 4:
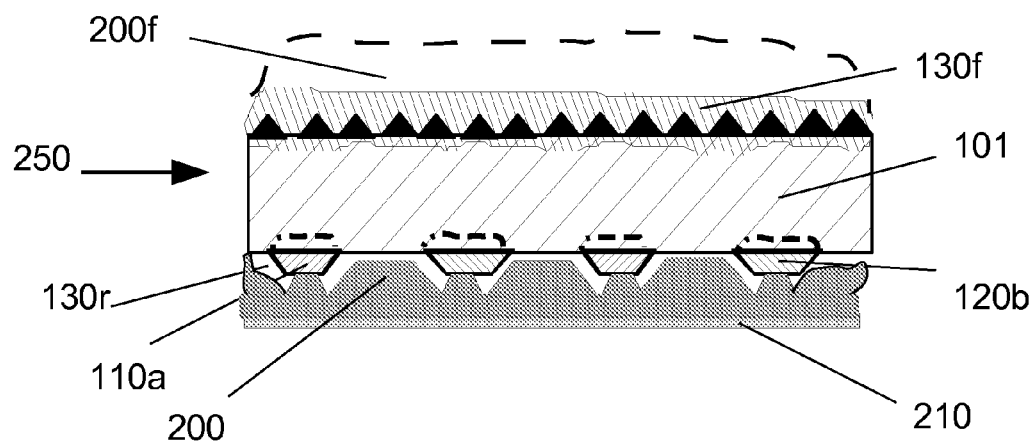
FIG. 4 shows a further step 4, in which backside conductive layers are applied onto the back side of the device over the backside insulating layers and into the windows thus forming an intermediate device structure Step 5 shown in FIG. 5, comprises unique electro-thermal processing (Joule heating) of the intermediate device structure of FIG. 4. The chamber for performing the Joule heating step is shown schematically.

Step 4, which is shown in FIG. 4, comprises forming an intermediate device structure 250 by depositing a first backside conductive layer 200 onto the backside insulating layer 130r and over the parts of the dopant-containing regions, which are exposed, and further depositing a second backside conductive layer 210 onto the first conductive layer 200. Conductive layers 200 and 210 are deposited sequentially onto the back side of the substrate 101. After the deposition, the first backside conductive layer 200 covers the surface of the insulating layer 130r (i.e. $Si_3N_4$) and forms a direct contact to the dopant-containing regions 110a, . . . 120b inside the backside windows 140a, . . . 150b of FIG. 3. The first backside conductive layer 200 is selected from the group of metals or metal pastes having a lower melting point, such as aluminum (Al), silver (Ag) or Al-containing pastes, such as Al—Ag, Al—Si or the like. The melting point for the above metals may be e.g. in the range from 400 C to 950 C. Also the first backside conductive layer 200 can be formed as a stack of metal sub-layers such as Al—Ag, Al—Ag—Zn or the like. The first backside conductive layer 200 may have a thickness in the range of 1 to 5 um.

The second conductive layer 210 is deposited next on the first backside conductive layer 200 and does not have a direct contact to the dopant-containing regions 110a, . . . 120b and to the surface of the insulating layer 130r. The second conductive layer 210 is selected from the group of metals having a higher melting point, such as e.g. titanium(Ti), palladium (Pd), tungsten (W), TiW and the like. The melting point for the above metals may be e.g. in the range from 1500 C to 3000 C. The second conductive layer 210 may have a thickness in the range of 1 to 5 um. Conductive layers 200 and 210 can be deposited sequentially e.g. by sputtering or evaporation, well known in art. It is understood that the entire structure of the first and second backside conductive layers can be formed as a stack of metal sub-layers wherein "inner" metal sub-layers (included in the first conductive layer 200) have lower melting points and wherein "outer" metal sub-layers (included in the second conductive layer 210) have higher melting points. In one aspect of the invention (shown below in FIGS. 15-16) a front-side conductive layer is simultaneously deposited on the surface of the front-side insulating layer 130f, which is schematically shown in FIG. 4 by reference 200f and by the dashed line above the layer 130f.

It should be noted that Steps 1 through 4 are used to form an intermediate device structure as a basis for subsequent completion of the most critical elements of the solar cell by Joule heating and electrical pulse treatments.

Figure 5:
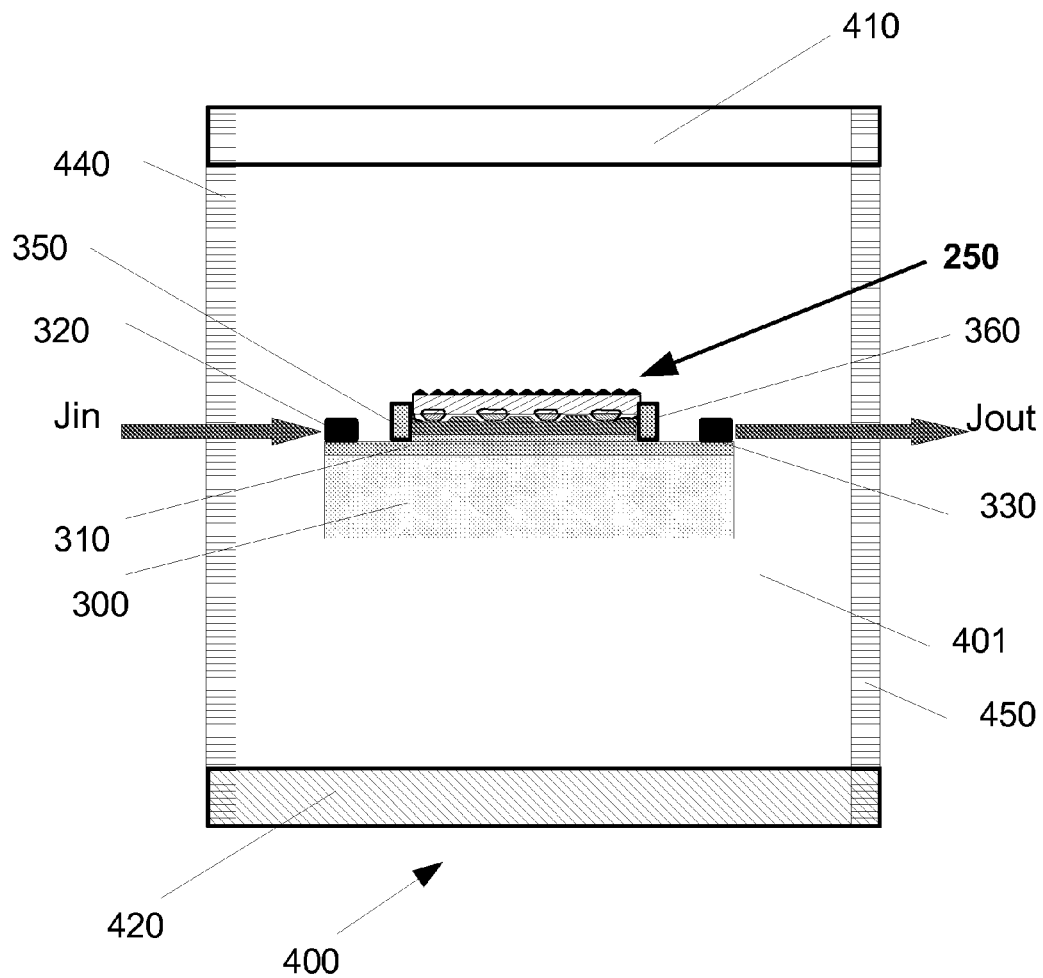

Step 5, which is shown in FIG. 5, comprises a unique electro-thermal processing of the intermediate device structure 250 (shown in details in FIG. 4). In this step (further referred to as JH-step), the intermediate device structure 250 is placed into a fixture 400, which is shown in schematic form and hereinafter is referred to as a Joule Heating (JH) chamber. JH-chamber is intended for Joule heating of the intermediate device structure and in particular, the backside dopant-containing regions (FIG. 4).

The JH-chamber is provided with a transparent pedestal 300 made of heat resistant materials such as glass, quartz or heat resistant plastic. Top surface of the pedestal 300 is covered with a pre-deposited contact conductive layer 310, which is made of a metal or a metal alloy with the high melting point such as e.g. Ti, W, Cr, TiW and the likes. Dimensions of the contact conductive layer 300 are chosen to overlap the outlines of the backside conductive layers 200 and 210 of FIG. 4. The pedestal 300 is provided with a current input electrode 320 and a current output electrode 330, which are formed on the surface of the layer 310 thus providing Ohmic contacts to the contact conductive layer 310. In order to provide uniform distribution of current density over entire current-passing areas of the conductive layer 200 and 210, profiles of the electrodes 320 and 330 should conform to the outline of the layer 310. The intermediate device structure 250 is placed on the surface of the contact conductive layer 310 between insulating and protecting holders 350 and 360. Electric power source (not shown) is placed outside the JH-chamber to generate a substantial electrical current (shown as Jin at the input electrode 320 and as Jout at the output electrode 330) between the input electrode 320 and the output electrode 330. It is understood, that in order to limit a current in an input circuit a plurality of the input electrodes can be used over the full width of the contact conductive layer 310.

The JH-chamber is further provided with a top cover 410, a bottom cover 420 and side walls 440 and 450. The top and bottom covers have inner surfaces (i.e. the surfaces facing the intermediate device structure 250), which are reflective for the purpose of reflecting back a radiation generated by the intermediate device structure 250 during the Joule heating. This can be accomplished e.g. by polishing inner metal surfaces of the covers. Side walls 440 and 450 can be made of heat resistant insulating materials such as e.g. heat resistant plastics. JH-chamber can be filled with the neutral gas 401 such as e.g., nitrogen The JH-step comprises passing electrical current through the first backside conductive layer and through the second backside conductive layer to heat the silicon substrate to the temperature required for diffusion of the dopant from the dopant-containing regions into the silicon substrate in order to form the backside selective emitters and the backside doped base contact regions, as well as essential parts of the contacts to the backside selective emitters and essential parts of the backside base contacts.

Now we describe an operation of the JH-step in details. When electrical current Jin flows through the conductive layers 310, 200 and 210, materials of all conductive layers experience Joule heating (which is also known as a resistive or Ohmic heating), which, in turn, will heat the entire intermediate device structure 250. Thus, the temperature of the first conductive layer increases, as well as the temperature of the underlying dopant-containing regions. Magnitude of the electrical current Jin is chosen so as to heat the treated first conductive layer and dopant substances in the dopant-containing regions 110a, 120b (FIG. 1-4) to the temperature needed to cause diffusion of the dopant atoms from the dopant-containing regions into the substrate. Depending on the specific parameters of the intermediate device structure the electrical current Jin may be in the range from 0.1 A to 10 A. This required temperature may be in the range of 850 C to 1050 C. The details of the diffusion processes during JH-step are shown in FIG. 6.

In the course of the JH-step the heated device structure 250 will receive thermal energy from the Joule heating process and simultaneously transfer thermal energy outward, by emitting infrared radiation from the front and from the back surfaces. The thermal balance will determine the equilibrium temperature of the silicon substrate 101 for any given parameters of the intermediate device structure and a power of Joule heating. It is understood that, due to the proper choice of metals or metal alloys for the contact conductive layer 310 and the second conductive layer 210, these conductive layers remain in a solid state (not melted) during the entire JH-step. On a contrary in the preferred embodiment of the method the first backside conductive layer 200 of FIG. 4 (with a lower melting point) will melt down before the temperature reaches required value. The molten first conductive layer is shown by reference 200m of the FIG. 6 below. For example, if a material of the layer 200 of FIG. 4 is Al or Al—Si alloy it will melt down at the temperature of about 650 C. Melting a material of the layer 200 will not prevent further heating of the intermediate device structure. It generates, however, a diffusion of the metal atoms into the dopant-containing regions (or directly into the substrate for the aspect of the method shown in FIGS. 14a and 14b). In order to prevent leakage out of the molten material of the first backside conductive layer 200m, the intermediate device structure 250 is sealed between the unsulating and protecting holders 350 and 360. The JH-step is completed by termination of electrical current upon and subsequent cooling of the intermediate device structure to an equilibrium state thus obtaining a second intermediate device structure, which is described below.

Figure 6:
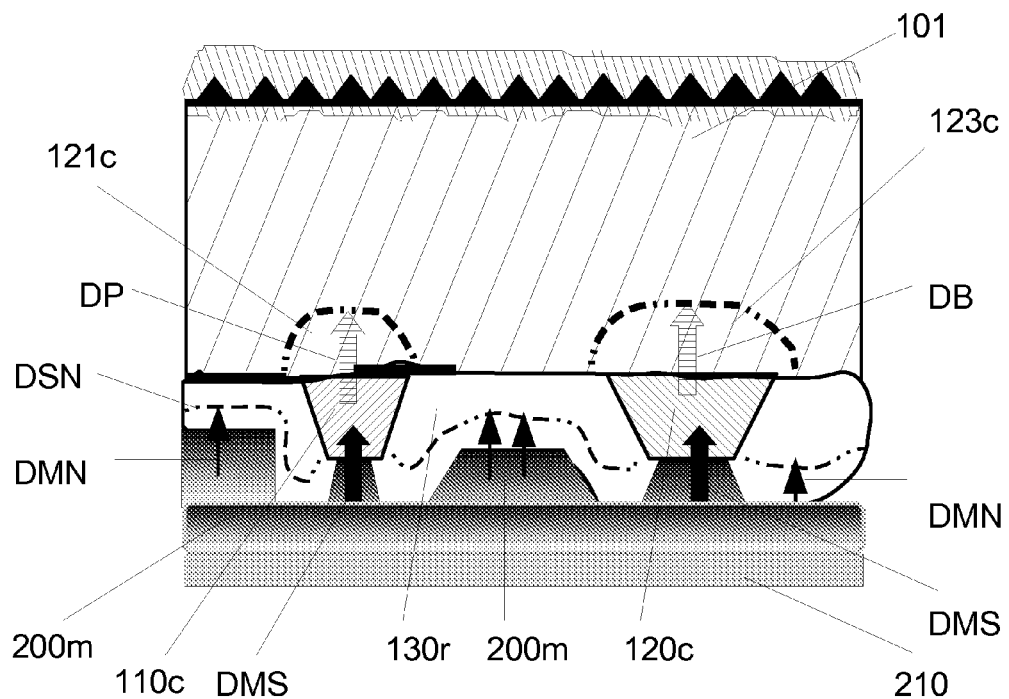
FIG. 6 shows the details of diffusion processes on the back side of the intermediate device structure during the Joule heating step of FIG. 5.

FIG. 6 shows details of diffusion processes, that are carried out in the back side of the intermediate device structure 250 during the JH-step of FIG. 5. In the course of JH-step dopant atoms of the dopant-containing regions 110c and 120c, (for simplicity only two regions are shown, which have evolved from the initial dopant-containing regions 110a and 120a of FIGS. 1-2) diffuse into the substrate 101, thus forming the backside selective emitters 121c. and the backside doped base contact (DBC) regions 123c. Motions of the diffusing atoms are shown as block arrows marked DP (i.e. "diffusion of phosphorus") and DB (i.e. "diffusion of boron") respectively, wherein the substrate 101 is assumed to be of P-type. A duration of the Joule heating, an electric current magnitude and radiative conditions at the top and bottom covers of the JH-chamber of FIG. 5 are set up to provide a desired depth and diffusion profiles in the selective emitters 121c and the DBC-regions 123c. For instance the selective emitters of N-type and the DBC-regions of P-type may have a depth in the range of 0.5 um to 1.5 um.

Simultaneously metal atoms from the heated and molten conductive layer 200m diffuse into the dopant-containing regions 110c and 120c, which is shown by the block arrows marked "DMS". In the preferred embodiment of the method the dopant-containing regions are chosen sufficiently thick to prevent or significantly reduce diffusion of metal atoms into the substrate 101 for the duration of the JH-step. For instance, thickness of the dopant-containing regions 110a, . . . 120b of FIG. 1-4 may be in the range of 500 nm to 2000 nm as was mentioned in the description of the step 1 of FIG. 1. Some limited diffusion of metal atoms into the substrate 101 is still possible, which may impact on a quality of the backside selective emitters and backside DBC-regions. Proper steps to restore a quality of the aforementioned regions will be described below. It should be noted that for the duration of the entire JH-step, and due to a proper choice of the second conductive layer 210 (high melting point), the layer 210 remains in a solid state and provides an Ohmic electrical contacts to the overlying molten layer 200m and to the underlying contact conductive layer 310.

Figure 7:
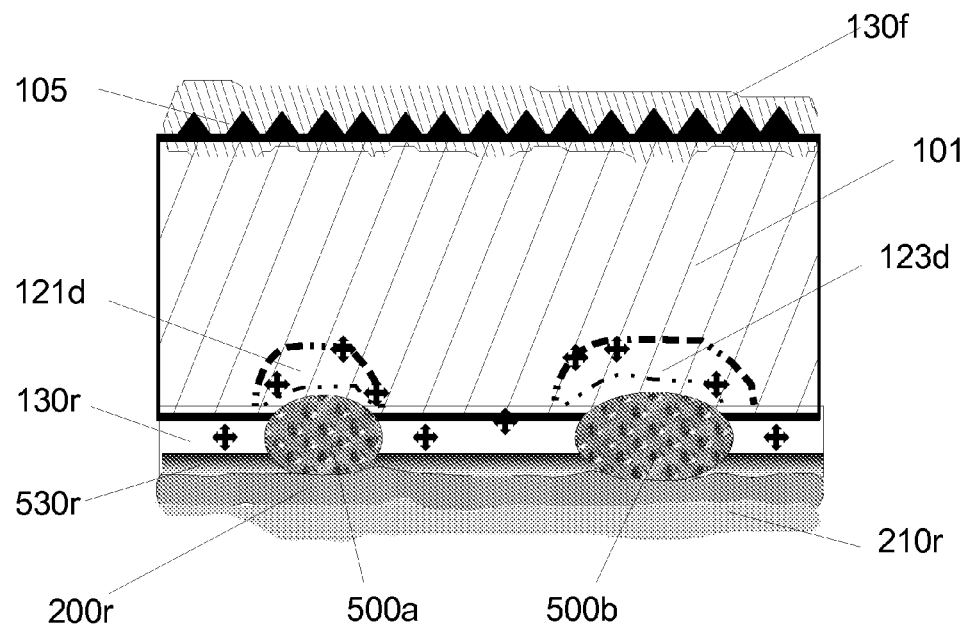
FIG. 7 is a cross-sectional view of the second intermediate device structure obtained after the Joule heating step of FIG. 5.

During the JH-step the metal interaction with the overlying dopant-containing regions 110c and 120c results in forming a highly conductive alloys (e.g. Si—Al—P and Si—Al—B), which, in turn, form self-aligned alloyed contact regions to the backside selective emitters 121c and to the backside DBC-regions 123c, which are shown in FIG. 7 by references 500a and 500b. These alloyed contact regions are essential parts of the contacts to the backside selective emitters and the backside base contacts, which are shown in the entirety in FIG. 10. It is understood that in order to improve a quality of the Ohmic contacts an additional annealing step may be necessary upon the completion of JH-step, which does not depart from the scope of this application.

Finally, during the JH-step metal atoms of the molten first conductive layer 200m will partially diffuse into the insulating layer 130r. This process is shown by the arrows marked "DMN". A thickness of the layer 130r, which typically comprises silicon nitride $Si_3N_4$ at the boundary with the first conductive layer 200 (FIG. 2-4), is chosen to reliably prevent a diffusion of metal (e.g. Al) atoms through the entire depth of the insulating layer 130r to the surface of the back side of the substrate 101. Due to the low diffusion constants of various metals in the $Si_3N_4$ an expected penetration of the metal (e.g. Al) atoms into the layer 130r during the JH-step will not exceed 20-30 nm. The details of the process can be found e.g. in the article titled "Study of the interaction between liquid aluminum and silicon nitride" by L. Mouradoff et al., published in the "Journal of the European Ceramic Society", v. 13, 1994, pp. 323-328. The penetration depth into the layer 130r is schematically shown as a dashed-dotted line marked "DSN". It is understood that a potential lateral diffusion of the dopant atoms (such as phosphorus and boron) into the insulating layer 130r during the JH-step is very limited and will not affect a passivation capability of the layer 130r in the areas between the selective emitters and doped base contact regions.

FIG. 7 is a cross-sectional view of a second intermediate device structure 270 obtained after the critical JH-step and before the subsequent pulse electrical treatment, which is described below. For simplicity in FIG. 7 and in subsequent drawings, the JH-chamber 400 (FIG. 5), in which the second intermediate device structure may remain to the end of the process, is not shown. As a result of the JH-step the backside selective emitters 121d and the backside DBC-regions 123d (only one region of each type is shown) are formed at the back side of the substrate 101. The boundaries of a possible metal atom penetration into the selective emitters and DBC-regions are shown as dashed-dotted lines inside selective emitter regions and DBC-regions respectively. Potential defects of the selective emitter's PN-jucntions and of the DBC-region's NP-junctions, which may be caused by metal atom penetration deeper into the doped regions, are marked by "x" symbols in the selective emitter regions and in the DBC-regions. Similarly, defects may also occur in the $Si_3N_4$ 130r because of diffusion, e.g., of Al atoms. The defects of this region are also marked by symbol "x".

At the completion of the JH-step the molten first conductive layer 200m of FIG. 6 is modified to the original solid state and finally solidified; thus forming a final first conductive layer 200r. In addition to the backside selective emitters 121d and the backside DBC-regions 123d, self-aligned alloyed contact regions are formed between the solidified first conductive layer 200r and the backside selective emitters, and between the layer 200r and the backside DBC-regions which is shown by the rough "bumped" oval areas 500a and 500b respectively.

Due to a partial penetration of metal atoms into the insulating film 130r a transitional alloyed layer 530r (e.g. Al—$Si_3N_4$) is formed in the insulating layer 130r at the boundary with the final first conductive layer 200r. As mentioned before, due to the low diffusion constants of metal atoms in $Si_3N_4$, an expected penetration of the metal atoms (e.g. Al) into the layer 130r during the JH-step does not exceed 20-30 nm.

It is understood that in the preferred embodiment of the method shown in FIGS. 1-4 and FIGS. 5-7 the front side of the intermediate device structures, and particularly the front-side insulating layer 130f, remains intact and preserves original optical and passivation qualities.

Figure 8:
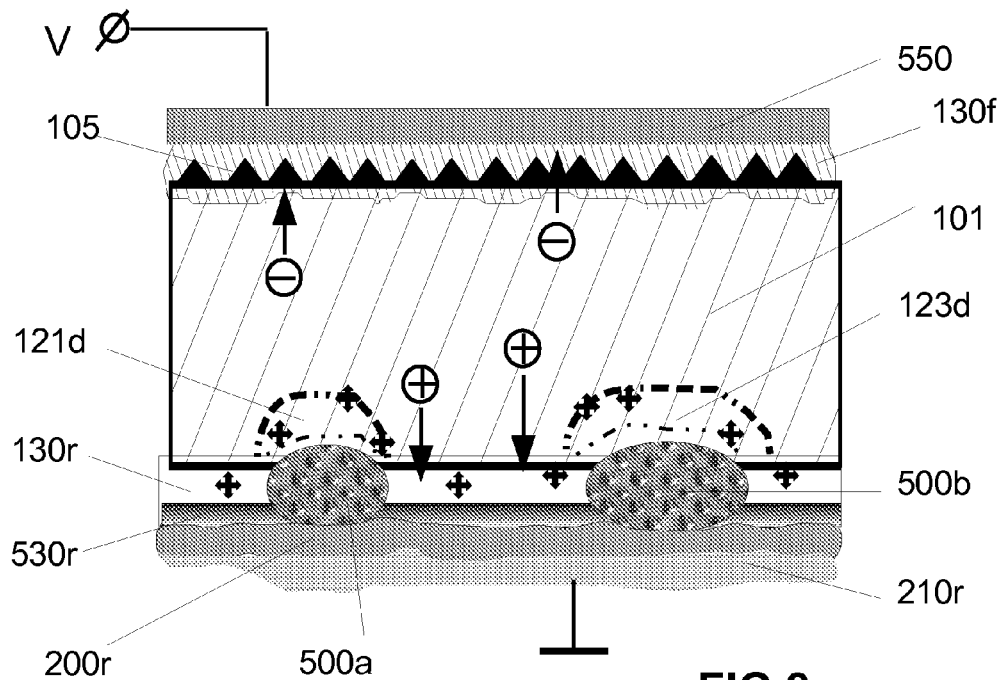
FIG. 8 illustrates a step, which is a pulse electrical treatment of the second intermediate device structure of FIG. 7 wherein a front-side conductive layer is applied onto the front side of the second intermediate device structure

FIG. 8 illustrates Step 6, which is a pulse electrical treatment of the second intermediate device structure 270 of FIG. 7. Prior to performing the pulse electrical treatment an additional front-side conductive layer 550 is formed on the surface of the front-side insulating layer 130f. The layer 550 is typically a metal layer deposited by sputtering, evaporation or other methods known in art. In the Step 6 at least one voltage pulse V is applied between the front-side conductive layer 550 and the second backside conductive layer 210r. A sequence of electrical pulses can be applied if necessary. It is understood that in case of performing this step inside the JH-chamber the voltage pulse or pulses can be applied directly to the contact conductive layer 310 through the electrodes marked "Jin" and "Jout" (FIG. 5). Furthermore, due to the extremely low electrical resistance between the first conductive layer and the second conductive layer, and relatively low resistance of the doped silicon substrate 101a voltage of the applied pulse V will be mainly distributed between the backside insulating layer 130r and the front-side insulating layer 130f.

Regarding the P-type silicon substrate 101, the pulse V must have a positive sign on the front side at the front-side conductive layer 550 as shown in FIG. 8. Regarding the N-type silicon substrate 101 (which is an equally valid choice for the device), the pulse V must have a negative sign on the front side. An electric field, which is associated with the applied pulse V causes a directional motion of electrons (mobile negative charges) and holes (mobile positive charges) in opposite directions and toward respective sides of the substrate as shown in FIG. 8 by arrows. The electric field of the pulse V causes holes (shown by symbols $\oplus$ in FIG. 8) to drift toward the back side and to enter the backside insulating layer 130r. At the same time, the electric field of the pulse V causes the electrons (shown by symbols $\ominus$ in FIG. 8) to drift toward the front side and to enter the front-side insulating layer 130f. It is understood that penetration of electrons and holes into respective insulating layers is typically carried out through the thin layer of silicon oxide $SiO_2$ and into the layer of $Si_3N_4$.

Figure 9:
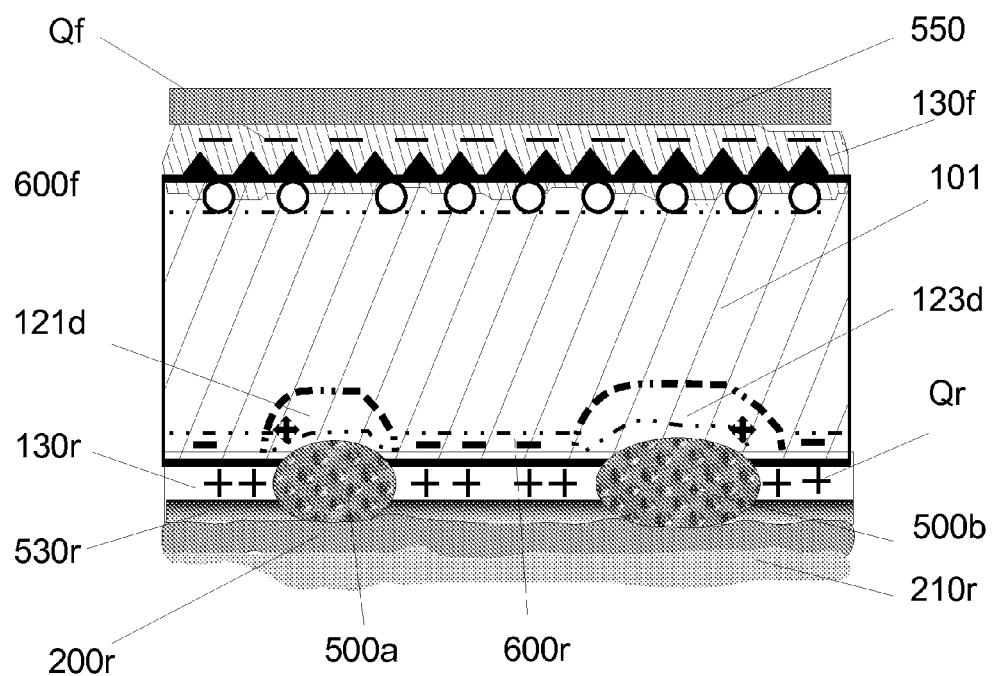
FIG. 9 is a cross-sectional view of the pre-final device structure obtained after the pulse electrical treatment step of FIG. 8.

As a result, as shown in FIG. 9, fixed charges of opposite signs (marked by "+" symbol on the back side and by "−" symbols on the front side) form in the backside insulating layer 130r and in the front-side insulating layer 130f. Consequently, once the positive fixed charge Qr is introduced into the backside insulating layer 130r an $N^+$-inversion layer 600r forms in the substrate 101 at the back side of the substrate, thus forming a backside field-induced emitter 600r.

At the same time, and as a result of introduction of the fixed negative charge into the front-side insulating layer 130f a P-type accumulation layer 600f forms at the front side of the substrate, thus forming a field-induced front surface field (FSF) region of the cell. It is understood that in a PV operation the backside field-induced emitter will contribute to a minority carrier collection from the substrate thus increasing an efficiency of the backside solar cell. It is also understood that the above polarity of the fixed charges and types of conductivity of corresponding field-induced emitter and FSF regions will have opposite signs for a N-type substrate.

The electrical pulse may have the following parameters: V in the range of 20 to 100V (depending on Si-nitride thickness and other factors), total duration in the range of 1 to 100 ms. If necessary, an embedded test structure can be used to test the field-induced emitter (inversion) formation and N-P junction quality.

Also, an application of the voltage pulse V of the above-described polarity will result in the pulse of a forward current through the backside selective emitter N-P junction as well as an electron injection from the essential parts of the backside base contacts 500b into DBC-regions 123d. It is assumed that these currents will eliminate ("cure") all or a significant number of the aforementioned defects (FIG. 6) in the selective emitter's NP-junctions and in the backside DBC-regions's PN junctions, which is shown in FIG. 9 by a reduced number of marks "x"

Figure 10:
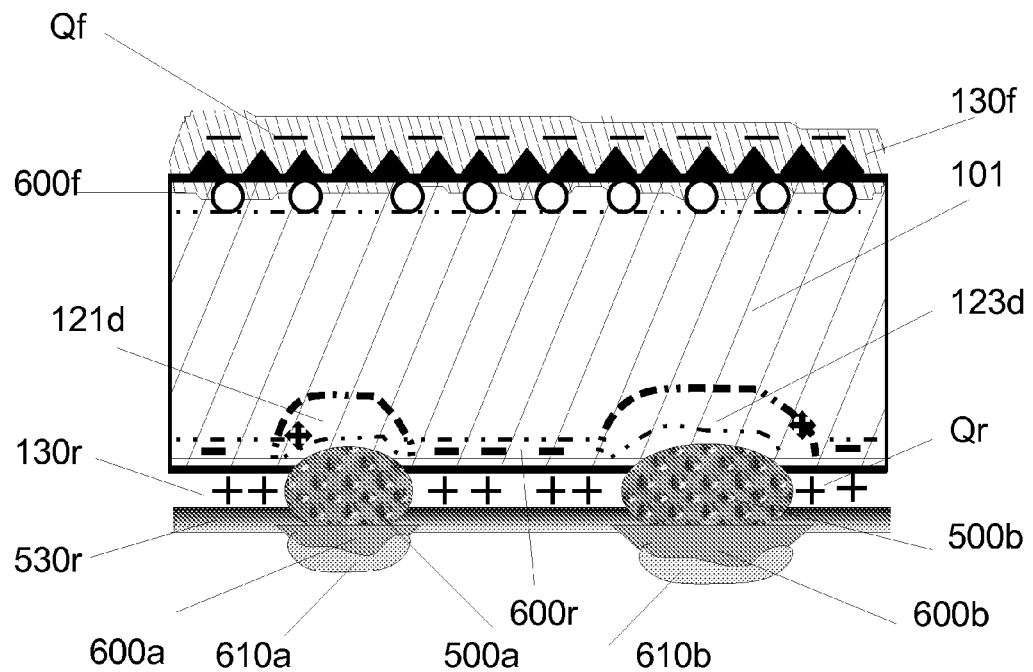
FIG. 10 illustrates a pre-final device structure of a backside solar cell in which the backside conductive layers are selectively etched off.
Figure 11:
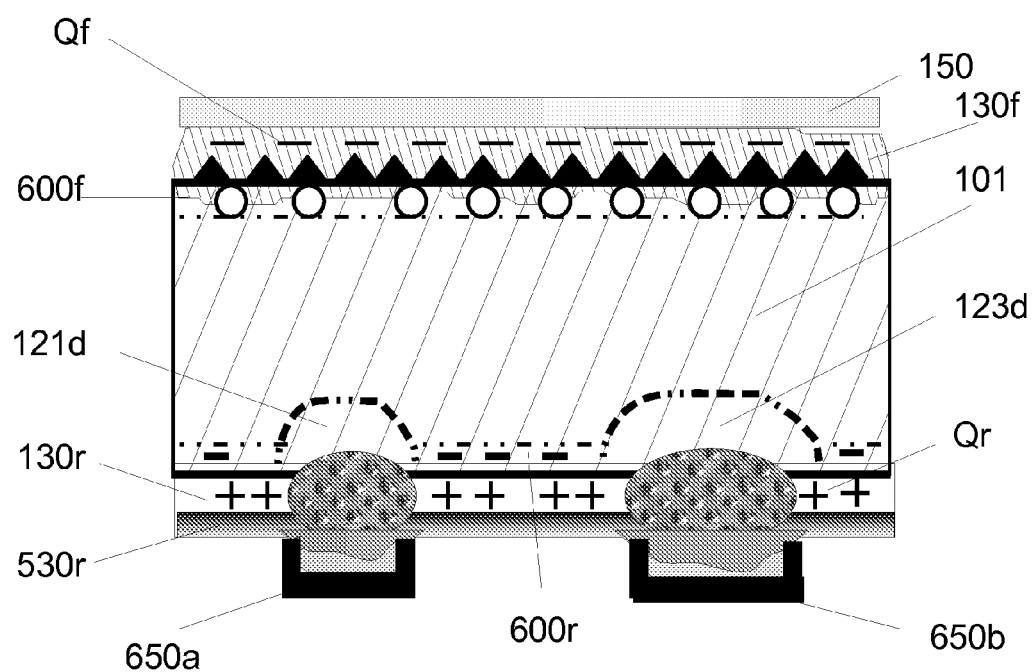
FIG. 11 shows a pre-final device structure of a backside solar cell in which an electroplating is done to provide output electrodes for the cell.

FIG. 10 shows step 7, in which the first backside conductive layer 200r and the second backside conductive layer 210r are selectively etched off the back side of the silicon substrate e.g. by a chemical etching (known in art as a lift-off process) thus forming contacts to the backside selective emitters and backside base contacts. The front-side conductive layer 550 is also removed from the front side. Since the essential parts of the contacts to the backside selective emitters 500a and to the backside base contacts 500b have substantially stronger adhesion to the substrate (due to the metal diffusion and alloy process described above), the selective etching of the backside conductive layers 200r and 210r (FIG. 9) leaves the regions 500a and 500b intact. Also self-aligned portions 600a and 600b of the first backside conductive layer and the self-aligned portions 610a and 610b of the second backside conductive layer remain adhered to the regions 500b and 500b respectively, thus forming complete contacts 620a to the backside selective emitters and complete contacts 620b to the backside DBC-regions, additionally providing conditions for forming final electrodes (FIG. 11). In other words, after selective etching a complete structure of the contacts to the selective emitter (shown as 620a) consists of the regions 500a, 600a and 610b, and a complete structure of the backside base contacts consists of the regions 500b, 600b and 610b. The device structure of FIG. 10 is a pre-final device structure.

Step 8 of FIG. 11 shows a final backside electrodes formation by electroplating. In this step thick metal or metals (such as Ni, Cu or likes) are electroplated onto exposed portions of the backside second conductive layer 610a and 610b, thus forming output electrodes 650a and 650b of the device. Final device structure of FIG. 11 represents a functional BS-SC.

Figure 12:
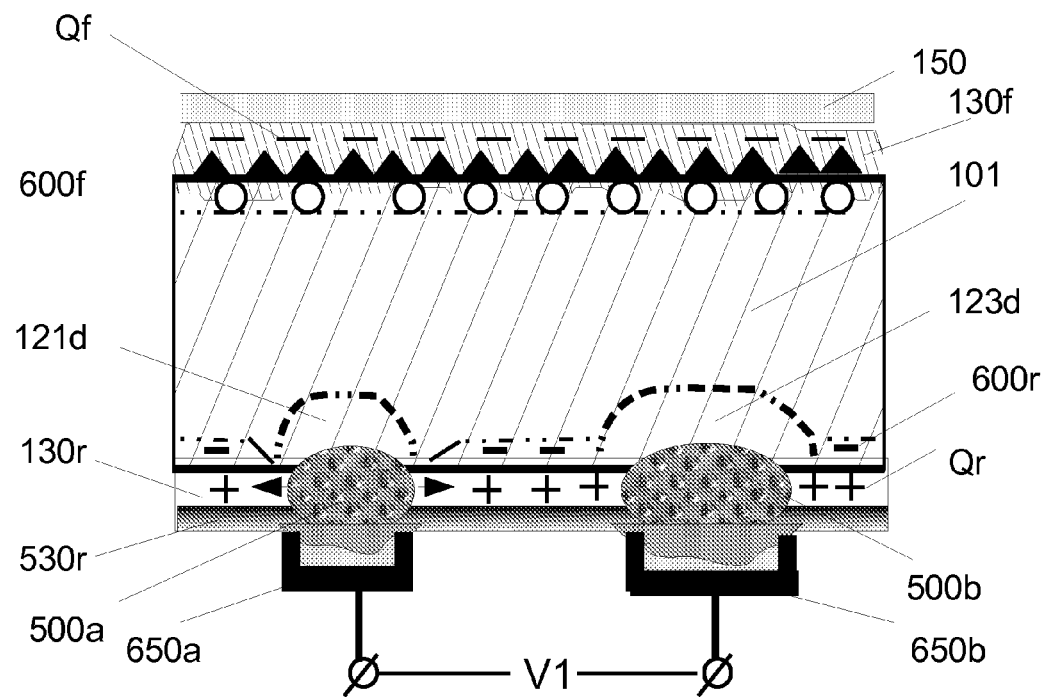
FIG. 12 illustrates an additional post-fabrication step, where an additional pulse electrical treatment of the pre-final device structure is used to limit an extension of the backside field-induced emitter toward the backside doped base contact regions.

Although the BS-SC shown in FIG. 11 is a fully functional device, an Energy Conversion Efficiency (ECE) in PV mode of operation may be somewhat reduced by a leakage between the backside field-induced emitter 600r and the backside DBC-regions 123d. In order to isolate the field-induced emitter 600r from the backside DBC-regions 123d the final device structure can be subjected to a second pulse electrical treatment by applying least one additional electrical pulse between the output electrodes 650a and 650b as shown in FIG. 12 by symbol "V1". In case of a P-type silicon substrate a polarity of the pulse V should be chosen to be negative for the DBC-regions 123d and positive for the selective emitters 121d (the opposite polarity should be used for an N-type substrate and corresponding opposite types of doping of the selective emitters and DBC-regions).

Figure 13:
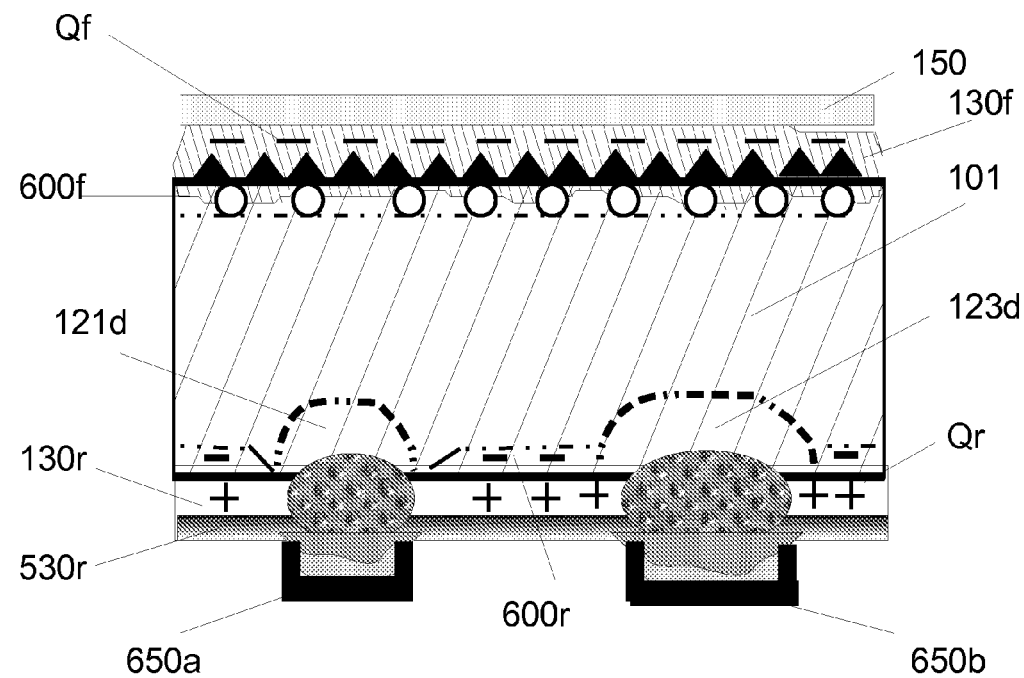
FIG. 13 shows a complete device structure of the backside solar cell.

As a result of applying the additional electrical pulse V1, electrons from the essential parts of the backside base contacts 500b and from underlying DBC-regions 123d will be injected into the substrate 101 and into the insulating layer 130r thus eliminating a part of the positive fixed charge Qr in the vicinity of the DBC-regions 123d. This is shown in FIG. 12 by the arrows directed out of the regions 500b. Consequently, field-induced emitter 600r (which is essentially an inversion layer) in the neighboring areas of the DBC-regions will be suppressed as shown in FIG. 12 and FIG. 13, wherein FIG. 13 is a final device structure of the BS-SC, according to the preferred embodiment of the method.

Figure 14A:
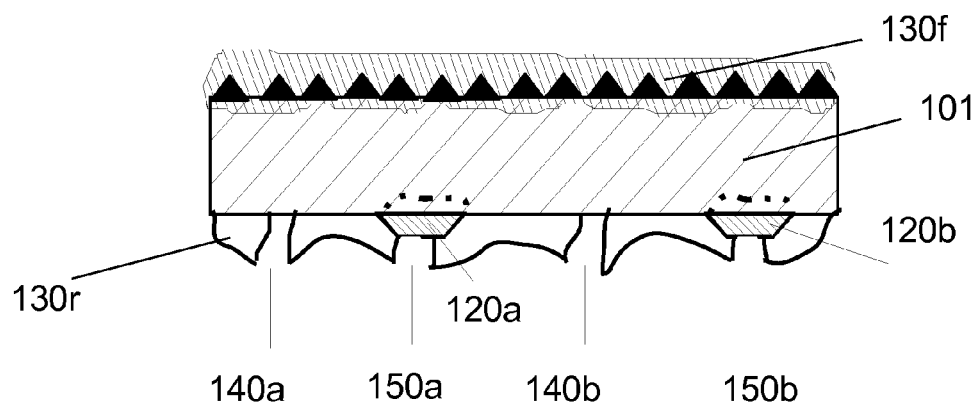
FIG. 14a illustrates an alternative intermediate step of the process, that is analogous to the step 3 of FIG. 3, for one aspect of the method, in which the dopant substance of one type is formed on the back side of the substrate and the windows are formed to the dopant-containing regions and to an uncovered backside surface of the substrate.

In one aspect of the method shown in FIG. 14a a dopant substance of only one type (N-type for a P-type substrate and P-type for a N-type substrate) is applied onto the back side 103 of the substrate 101 to form local dot-like or stripe-like dopant-containing regions 125a and 125b. In this aspect backside windows 170a and 170b are formed in the insulating layer 130r and protrude to the bare surface of the back side 103.

Figure 14B:
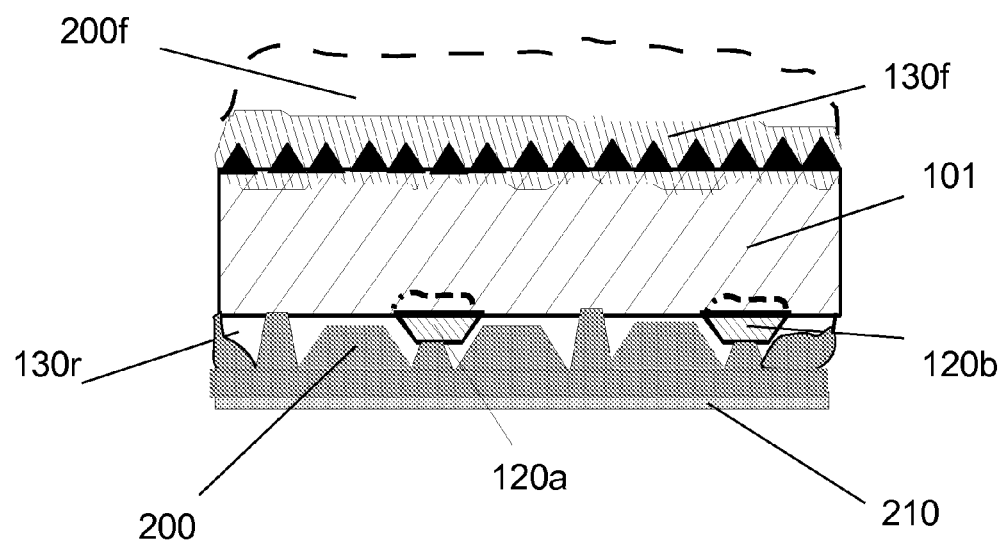
FIG. 14b shows a further alternative intermediate step of the process, which is analogous to the step 4 of FIG. 4, for the above aspect of the method, in which the backside conductive layers are applied onto the back side of the substrate over the backside insulating layer and into the windows. The further steps (not shown) are equivalent to the steps of FIGS. 5-11.

Simultaneously the backside windows 180a and 180b are cut through the insulating layer 130r to the dopant-containing regions 125a and 125b, similar to the step 2 of FIG. 3. Consequently, as shown in FIG. 14b, the first backside conductive layer 200 and the second conductive layer 210 are applied onto the back side 103 as described above for the FIG. 4. After the deposition, the first backside conductive layer 200 covers the surface of the insulating layer 130r (i.e. $Si_3N_4$) and forms a direct contact to the back-side surface 103 of the substrate 101 at the locations of the windows 170a and 170b (FIG. 14a) and to the dopant-containing regions 125a and 125b at the locations of the windows 180a and 180b. In this case the first backside conductive layer 200 is preferably Al or Al—Si alloy to ensure forming the backside doped base contact regions at further steps as described below. The further steps for this aspect of the method (not shown) are analogous to the steps of FIGS. 5-13

Figure 15:
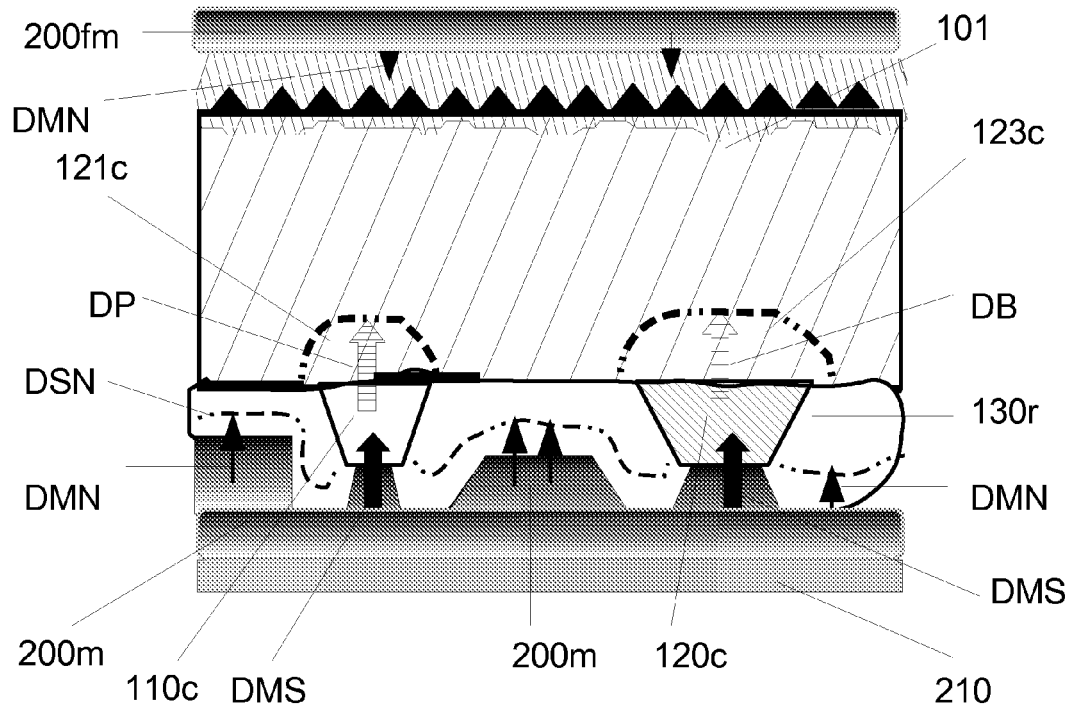
FIG. 15 shows details of the diffusion processes during the Joule heating step for another aspect of the method, in which the front-side conductive layer is applied onto the front surface of the intermediate device structure at the step 4 of FIG. 4 and prior to performing a Joule heating step of FIG. 5.

FIG. 15 illustrates another embodiment of the method and is analogous to the FIG. 6. In this embodiment in addition to depositing the first backside conductive layer 200 (FIG. 4) a front-side conductive layer 200f is simultaneously deposited on the surface of the front-side insulating layer 130f as shown in FIG. 4 by the dashed line. FIG. 15 shows the diffusion processes carried out on the back side and on the front side of the intermediate device structure during the JH-step of FIG. 5. In addition to the processes described in details in reference to FIG. 6 a diffusion of metal atoms from the molten front-side conductive layer 200fm into the front-side insulating layer 130f will occur, which is shown by down arrows marked "DMN" in FIG. 15. Penetration of the metal atoms into the layer 130f is limited and is similar to the penetration into the backside insulating layer 130r as described above in reference to FIG. 6.

Figure 16:
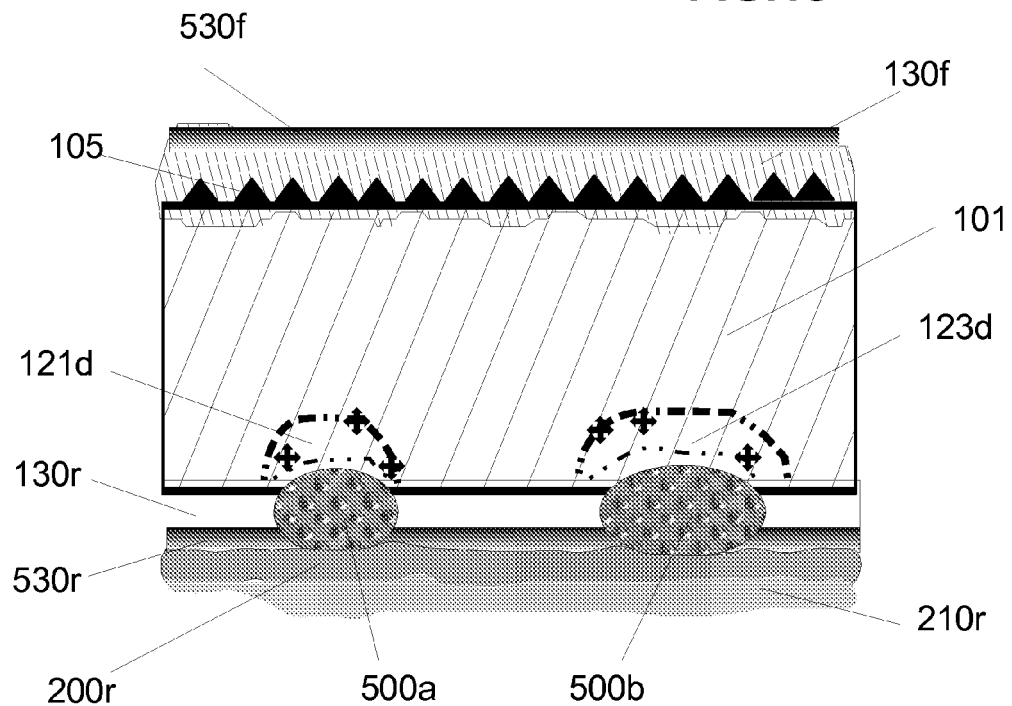
FIG. 16 is a cross-sectional view of the second intermediate device structure for the above aspect of the method obtained after the Joule heating step of FIG. 5. The rest of the steps are omitted due to their similarity to the steps of the main embodiment (FIG. 9-13).

After the JH-step, a solidified front-side conductive layer 530f remains on the surface of the front-side insulating layer 130f as shown in FIG. 16. The layer 530f can be used for a subsequent electrical pulse treatment, which is shown in FIG. 8. The rest of the steps are analogous to the steps 9-13 of the main embodiment.

If necessary, the final device structure shown in FIG. 13 may require some minor finishing operations, such as chemical or mechanical polishing, chemical cleaning, or additional electroplating of the backside electrodes. None of these operations represents a significant embodiment of the present method.

Although the present invention is shown and described with reference to specific embodiments, it is understood that these embodiments should not be construed as limiting the areas of application of the invention and that any changes and modifications are possible provided that these changes and modifications do not depart from the scope of the attached patent claims. For example, dopant substances may be other than those indicated in the specification. The JH-chamber, used for Joule heating of the intermediate device structure, may have various designs. The method applies to manufacturing not only of solar cells but to any other suitable electronic devices. The silicon substrate may be of an N-type, in which case the types of dopant substances and polarities of electrical pulses should be opposite to the ones used in the preferred embodiment above.

The invention claimed is:

1. A backside silicon photovoltaic cell and method of manufacturing thereof comprising a silicon substrate that has a front side and a back side, backside selective emitters, backside doped base contact regions, contacts to said backside selective emitters and backside base contacts, the method comprising the steps of:
   a. forming said backside selective emitters by Joule heating
   b. forming said backside doped base contact regions by Joule heating.

2. The method of claim 1, wherein the backside silicon photovoltaic cell further comprises a backside field-induced emitter, the method further comprising the step of forming said backside field-induced emitter by a pulse electrical treatment.

3. The method of claim 2, wherein the backside silicon photovoltaic cell further comprises a field-induced front surface field region, the method further comprising the step of forming said field-induced front surface field region by said pulse electrical treatment.

4. The method of claim 1, further comprising forming said contacts to said backside selective emitters and said backside base contacts by the steps of Joule heating and selective etching of the back side of the silicon substrate.

5. The method of claim 4, comprising the following steps, which are completed prior to the step of Joule heating:
   forming dopant-containing regions on the back side of the silicon substrate in the areas designed at least for the backside selective emitters;
   forming a backside insulating layer onto the back side of the silicon substrate and over said dopant-containing regions;
   forming backside windows in said backside insulating layer over the dopant-containing regions to expose at least a part of the surface of the dopant-containing regions;
   depositing a first backside conductive layer onto said backside insulating layer, and over the parts of said dopant-containing regions, which are exposed, and further depositing a second backside conductive layer onto said first backside conductive layer.

6. The method of claim 5, wherein the step of Joule heating comprises passing electrical current through said first backside conductive layer and through said second backside conductive layer to heat the silicon substrate to the temperature required for diffusion of the dopant from said dopant-containing regions into the silicon substrate in order to form the backside selective emitters and the backside doped base contact regions, essential parts of the contacts to the backside selective emitters and essential parts of the backside base contacts, the step further comprising termination of said electrical current upon completion of said diffusion and subsequent cooling the silicon substrate thereof.

7. The method of claim 6, further comprising forming contacts to the backside selective emitters and the backside base contacts by selective etching of the back side of the silicon substrate.

8. The method of claim 3, wherein the method comprises the following steps, which are completed prior to the step of Joule heating
   forming dopant-containing regions on the back side of the silicon substrate in the areas designed at least for the backside selective emitters;

forming a backside insulating layer onto the back side of the silicon substrate and over said dopant-containing regions;

forming a front-side insulating layer onto the front side of the silicon substrate;

forming backside windows in said backside insulating layer over the dopant-containing regions to expose at least a part of the surface of the dopant-containing regions;

depositing a first backside conductive layer onto said backside insulating layer, and over the parts of said dopant-containing regions, which are exposed, and further depositing a second backside conductive layer onto said first backside conductive layer.

9. The method of claim 8, wherein the step of Joule heating comprises passing electrical current through said first backside conductive layer and through said second backside conductive layer to heat the silicon substrate to the temperature required for diffusion of the dopant from said dopant-containing regions into the silicon substrate in order to form the backside selective emitters and the backside doped base contact regions, essential parts of the contacts to the backside selective emitters and essential parts of the backside base contacts, the step further comprising termination of said electrical current upon completion of said diffusion and subsequent cooling the silicon substrate thereof.

10. The method of claim 9, further comprising the step of depositing a front-side conductive layer onto the front-side insulating layer upon the completion of the Joule heating step.

11. The method of claim 10, comprising the step of forming the backside field-induced emitters and the field-induced front surface field region by a pulse electrical treatment, said pulse electrical treatment comprising applying at least one electrical pulse between said front-side conductive layer and said backside second conductive layer.

12. The method of claim 11, further comprising forming the contacts to said backside selective emitters and the backside base contacts by the step of selective etching of the back side of the silicon substrate, wherein the contacts to the backside selective emitters and the backside base contacts are formed to be self-aligned.

13. The method of claim 12, further comprising the step of forming output electrodes of the semiconductor device by electroplating.

14. The method of claim 13, further comprising the step of applying at least one additional electrical pulse between the output electrodes of the semiconductor device in order to isolate the backside field-induced emitters from the backside doped base contact regions.

15. The method of claim 8, wherein the step of forming the dopant-containing regions comprises a process selected from the group consisting of screen-printing and jet-printing and wherein the dopant substance is selected from the group consisting of doped silicon nanoparticles, phosphorus-containing paste, boron-containing paste, or a combination thereof.

16. The method of claim 8, wherein the first backside conductive layer is selected from the group consisting of metals and metal pastes, said metals having a lower melting point, said metal being further selected from the group consisting of silver, aluminum, aluminum paste or combinations thereof.

17. The method of claim 16, wherein the second backside conductive layer is selected from the group consisting of metals having a higher melting point, said metal being further selected from the group consisting of titanium, palladium, tungsten or combinations thereof.

18. The method of claim 9, wherein the step of Joule heating is performed at the thermally balanced conditions.

19. A backside silicon photovoltaic cell and method of manufacturing thereof comprising a silicon substrate that has a front side and a back side, backside selective emitters, backside doped base contact regions, contacts to said backside selective emitters and backside base contacts, backside field-induced emitter and field-induced front surface field region, the method comprising the steps of:

providing a silicon substrate that has a front side and a back side, forming dopant-containing regions on the back side of the silicon substrate in the areas designed at least for the backside selective emitters;

forming a silicon oxide layer at least on the back side of the silicon substrate forming a backside insulating layer onto the back side of the silicon substrate and over said dopant-containing regions;

forming a front-side insulating layer onto the front side of the silicon substrate;

forming backside windows in said backside insulating layer over the dopant-containing regions to expose at least a part of the surface of the dopant-containing regions;

depositing a first backside conductive layer onto said backside insulating layer, and over the parts of said dopant-containing regions, which are exposed, and further depositing a second backside conductive layer onto said first backside conductive layer, thus obtaining an intermediate device structure, performing a Joule heating step by passing electrical current through said first backside conductive layer and through said second backside conductive layer to heat the silicon substrate to the temperature required for diffusion of the dopant from said dopant-containing regions into the silicon substrate in order to form the backside selective emitters, the backside doped base contact regions, essential parts of the contacts to said backside selective emitters and essential parts of the backside base contacts, cooling the intermediate device structure to an equilibrium state, thus obtaining a second intermediate device structure, depositing a front-side conductive layer onto the front-side insulating layer of the second intermediate device structure, subjecting the second intermediate device structure to pulse electrical treatment by applying at least one electrical pulse between said front-side conductive layer and said backside second conductive layer, removing parts of the first backside conductive layer and the second backside conductive layer by the step of selective etching, thus forming the contacts to the backside selective emitters and the backside base contacts, removing the front-side conductive layer, depositing output electrodes to the backside selective emitters and to the backside doped base contact regions by electroplating, thus obtaining a final device structure, subjecting the final device structure to a second pulse electrical treatment by applying at least one additional electrical pulse between said output electrodes, in order to isolate the backside field-induced emitter from the backside doped base contact regions.

20. A backside silicon photovoltaic cell and method of manufacturing thereof comprising a silicon substrate that has a front side and a back side, backside selective emitters, backside doped base contact regions, contacts to said backside selective emitters and backside base contacts, backside field-induced emitter and field-induced front surface field region, the method comprising the steps of:

provided a silicon substrate that has a front side and a back side, forming dopant-containing regions on the back side of the silicon substrate in the areas designed at least for the backside selective emitters;

forming a backside insulating layer onto the back side of the silicon substrate and over said dopant-containing regions;

forming a front-side insulating layer onto the front side of the silicon substrate;

forming backside windows in said backside insulating layer over the dopant-containing regions to expose at least a part of the surface of the dopant-containing regions;

depositing a first backside conductive layer onto said backside insulating layer, and over the parts of said dopant-containing regions, which are exposed, and further depositing a second backside conductive layer onto said first backside conductive layer, thus obtaining an intermediate device structure, depositing a front-side conductive layer onto said front-side insulating layer, thus obtaining an intermediate device structure, performing a Joule heating step by passing electrical current through said first backside conductive layer and through said second conductive layer to heat the dopant-containing regions to the temperature required for diffusion of the dopant from said dopant-containing regions into the silicon substrate in order to form the backside selective emitters, the backside doped base contact regions, essential parts of the contacts to said backside selective emitters and essential parts of the backside base contacts, cooling the intermediate device structure to an equilibrium state, thus obtaining a second intermediate device structure subjecting the second intermediate device structure to pulse electrical treatment by applying at least one electrical pulse between said front-side conductive layer and said backside second conductive layer, removing parts of the first backside conductive layer and the second backside conductive layer by the step of selective etching, thus forming the contacts to the backside selective emitters and the backside base contacts, removing the front-side conductive layer depositing output electrodes to the backside selective emitters and to the backside doped base contact regions by electroplating, thus obtaining a final device structure, subjecting the final device structure to a second pulse electrical treatment by applying at least one additional electrical pulse between said output electrodes, in order to isolate the backside field-induced emitter from the backside doped base contact regions.

21. The method of claim 19, wherein the semiconductor device is a backside solar cell.

22. The method of claim 20, wherein the semiconductor device is a backside solar cell.

* * * * *